(12) United States Patent
Murphy (10) Patent No.: US 9,320,180 B2
(45) Date of Patent: Apr. 19, 2016

(54) APPARATUS AND METHOD FOR COOLING AND RECOVERING HEAT FROM CABLES AND TRANSFORMERS

(76) Inventor: Craig Murphy, Bromsgrove (GB)

( * ) Notice: Subject to any disclaimer, the term of this patent is extended or adjusted under 35 U.S.C. 154(b) by 347 days.

(21) Appl. No.: 13/881,669

(22) PCT Filed: Nov. 7, 2011

(86) PCT No.: PCT/GB2011/052155
§ 371 (c)(1),
(2), (4) Date: Jul. 15, 2013

(87) PCT Pub. No.: WO2012/059772
PCT Pub. Date: May 10, 2012

(65) Prior Publication Data
US 2013/0279116 A1    Oct. 24, 2013

(30) Foreign Application Priority Data

Nov. 5, 2010   (GB) .................................. 1018717.7

(51) Int. Cl.
| | | |
|---|---|---|
| *H05K 7/00* | (2006.01) | |
| *H05K 5/00* | (2006.01) | |
| *H05K 7/20* | (2006.01) | |
| *H01B 7/42* | (2006.01) | |
| *H01F 27/10* | (2006.01) | |
| *H02G 3/03* | (2006.01) | |
| *F24D 3/18* | (2006.01) | |

(52) U.S. Cl.
CPC *H05K 7/209* (2013.01); *F24D 3/18* (2013.01); *H01B 7/423* (2013.01); *H01F 27/10* (2013.01); *H02G 3/03* (2013.01); *F24D 2200/11* (2013.01);

(Continued)

(58) Field of Classification Search
CPC ........................................................ H01F 27/12
USPC .................................................. 361/699, 700
See application file for complete search history.

(56) References Cited

U.S. PATENT DOCUMENTS 4,512,387 A    4/1985   Rodriguez et al.

FOREIGN PATENT DOCUMENTS

| DE | 2423717 | 11/1975 |
|---|---|---|
| DE | 19820379 | 7/1999 |

(Continued)

OTHER PUBLICATIONS

UK IPO Search Report dated Feb. 23, 2011.

(Continued)

*Primary Examiner* — Jerry Wu
(74) *Attorney, Agent, or Firm* — Michael Best & Friedrich LLP (57) ABSTRACT

The present invention provides an apparatus (100) and method for cooling and recovering heat energy from power cables and/or transformers. The apparatus (100) comprises a first conduit (102) in thermal contact with at least one electrical power cable (104) and/or at least one transformer, a heat transfer device (106) coupled to the first conduit (102), fluid circulating means (112) and a heating circuit (114) coupled to the heat transfer device (106) for interfacing with an external heating system (126), such as those typically installed in domestic or commercial premises (128). When in use, the circulating means (112) is operable to circulate a fluid through the first conduit (102) to thereby enable the heat transfer device (106) to recover at least a portion of the heat energy of the cable (104) and/or transformer from the heated fluid for subsequent reuse by an external heating system (126) via the heating circuit (114). The apparatus and method are found to be particularly suited for the recovery and reuse of wasted heat from subterranean high-tension power cables and above surface substation transformers, while cooling the equipment to improve operational performance and lifetime.

31 Claims, 3 Drawing Sheets

(52) U.S. Cl.
CPC ......... *F24D 2200/16* (2013.01); *F24D 2200/29* (2013.01); *Y02B 10/40* (2013.01); *Y02B 10/70* (2013.01); *Y02B 30/12* (2013.01); *Y02B 30/52* (2013.01)

(56) References Cited

FOREIGN PATENT DOCUMENTS

| EP | 0955712 | 11/1999 | | |
| FR | 2520853 | 8/1983 | | |
| GB | 612482 | 11/1948 | | |
| GB | 1520780 | 8/1978 | | |
| GB | 2073498 | 10/1981 | | |
| GB | 2073498 A | * 10/1981 | ............. | H01F 27/12 |

OTHER PUBLICATIONS

PCT International Search Report and Written Opinion for Application No. PCT/GB2011/052155.

* cited by examiner

APPARATUS AND METHOD FOR COOLING AND RECOVERING HEAT FROM CABLES AND TRANSFORMERS

RELATED APPLICATIONS

This patent application is a national stage filing under 35 U.S.C. §371 of International Application No. PCT/GB2011/052155, filed on Nov. 7, 2011, which claims priority to Great Britain Patent Application No. 1018717.7.9, filed on Nov. 5, 2010. Priority to each application is hereby claimed, and the contents of each application are incorporated herein by reference.

The present invention relates to the cooling of electrical power distribution and transmission equipment, and particularly relates to an apparatus and method for cooling and recovering heat from cables and transformers.

For practical safety reasons it is usual in urban areas to distribute electrical power via sub-surface or subterranean high-voltage power cables, as opposed to using aerial supports, such as pylons etc. Therefore, beneath most modern cities and towns there exist extensive networks of power cables coupled to localised transformer sub-stations, which receive electricity from power generation facilities.

Typically, the power cables in urban areas are susceptible to high loads (i.e. large currents) due to the energy demands from the concentrated populace and workforce in these areas. Hence, as a consequence of carrying large currents, the cables may exhibit significant heating due to the inherent resistance of the cable's conductive core. It is found that the heat generated by resistive heating of the core can raise the temperature of the cable to well above the ambient temperature of the surrounding subterranean material. For operational reasons, utility companies prefer to operate the cables at a temperature of between ambient (e.g. the temperature of the ground at the depth of the cable) and 40° C. However, at times of high demand the cables may often operate at temperatures approaching up to 90° C., and may even rise to 120° C., under extreme loading conditions.

At such temperatures the cables themselves commonly deform by way of thermal expansion, followed by subsequent contraction as the demand falls (i.e. as the current drops off). However, the repeated expansion and contraction of the cable can prematurely shorten the operational lifetime of the cable, and may also have negative impact on the integrity of the cable joints and connections. The replacement of cables is usually an expensive operation for a utility company, particularly as subterranean cables require excavation, which not only requires specialised digging machinery, but can also cause widespread disruption to traffic and pedestrians in urban areas.

Therefore, the heating of power cables is generally quite problematic to utility companies. Although it is possible to re-route power supplies during periods of high demand, in an attempt to balance the loads across the available cable network (e.g. to let some cables cool down), this is not always found to be successful, and in any event can reduce the capacity of the network at a time when demand must be met.

Moreover, as power cables are normally laid in sets of three cables within the same excavated trench, it is easy to appreciate that a substantial amount of heat energy can be generated by the combined cables even during periods of relatively low demand. Utility companies have previously attempted to address the problem of cable heating by using water-cooled jackets around the cables or air-blowing devices, but these arrangements have had only limited success and are generally costly to implement.

In addition to the operational constraints and decreased cable longevity, another important aspect of the cable heating is the significant waste of heat energy that is dissipated into the surrounding ground. At a time of enhanced environmental awareness, diminishing natural resources and rising energy costs, failure to make use of the heat from the current carrying cables is a notable problem which has not been addressed by the prior art. As most governments have now set targets on greenhouse gas emissions, there is an ever-increasing burden on utility companies to reduce $CO_2$ emission by supplying energy more efficiently, while attempting to meet the present and escalating future demands of consumers.

Therefore, it is an object of the present invention to address some, if not all, of the above problems in the art, by providing an apparatus and method which allows for efficient cooling of power cables, and optionally any associated transformers, while enabling the recovery of at least part of the heat generated by the cables and/or transformers.

According to a first aspect of the present invention there is provided an apparatus for cooling and recovering heat from electrical power cables and/or transformers, comprising:
   a first conduit in thermal contact with at least one electrical power cable and/or at least one transformer;
   a heat transfer device coupled to the first conduit;
   fluid circulating means; and
   a heating circuit coupled to the heat transfer device for interfacing with an external heating system,
   wherein, in use, the circulating means is operable to circulate a fluid through the first conduit to thereby enable the heat transfer device to recover at least a portion of the heat energy of the cable and/or transformer from the heated fluid for subsequent reuse by an external heating system via the heating circuit.

The provision of a first conduit in thermal contact with at least one electrical power cable and/or transformer, a heat transfer device coupled to the first conduit and fluid circulating means is found to be particularly advantageous as at least a portion of the heat energy generated by the cable and/or transformer can be removed by the circulating fluid and recovered by the action of the heat transfer device. In this way, the apparatus is able to perform a dual function, in that not only does the circulating fluid serve to cool the cable (and lower the cable temperature), but heat energy may also be recovered by the heat transfer device for subsequent reuse by an external heating system via the heating circuit.

It is be appreciated that references herein to 'electrical power cable' or the shortened form 'cable' are to be taken to include all forms of electrical current-carrying cable, particularly subterranean, including hi-tension power cables and any other type of cable suitable for power propagation and transmission. Indeed, the cable may form part of a transformer winding. Moreover, although specific reference may be made to a single cable, it is to be understood that this is not limiting, and therefore all embodiments may be extended to arrangements in which two, three or more cables are present without deviating from the invention. Indeed, in practice, power cables are normally laid in sets of three cables for operational reasons, and therefore the apparatus and method disclosed herein may be used with only one cable or three, or otherwise scaled up or down according to the required cooling arrangement.

In addition, the references to "transformer" or "transformers" are intended to encompass all electrical current carrying transformers, particularly those as used in power distribution sub-station arrangements, and therefore may include both above ground transformers and subterranean transformers.

No limitation is implied as to the nature of the transformer, other than it must be suitable for use with the apparatus of the present invention, but the transformer will typically be comprised of a ferrous core with a plurality of cable windings wrapped around the core. References herein to 'an external heating system' are to be taken to include any fluid-based heating system for domestic or commercial premises or properties, such as a gas, oil or electric central heating system or an under-floor heating system etc. The domestic premises may include, but are not limited to, houses, bungalows, apartments, elderly care homes etc., while the commercial premises may include offices, factories and retail outlets etc. Moreover, the external heating system may also correspond to the heating systems of schools, hospitals, civic buildings and municipal buildings, such as libraries and public swimming pools etc.

The first conduit is in thermal contact with the at least one electrical power cable and/or the windings of the transformer. By 'thermal contact' we mean that heat energy is able to pass from the cable or windings to the first conduit by at least, and most preferably, conductive processes. The first conduit may therefore be in physical contact with the cable or windings, to permit direct heat transfer between the exterior surfaces of the conduit and the cable, or alternatively, the first conduit may be spaced from the exterior cable surface by intervening material (such as soil or earth, or a dissipative media e.g. a porous mineral rock etc.), which is at least partially thermally conductive.

Preferably, the first conduit is a pipe having an internal bore for the flow of fluid therethrough. The pipe may be made from a metal, such as copper, or a high-melting point plastic (i.e. a melting point above the highest operating temperature of the cable). Preferably, the pipe is substantially rigid, but may alternatively be flexible depending on the particular application. Of course, any heat resistant pipe material may alternatively be used.

In preferred embodiments, the first conduit is disposed proximally to the at least one electrical power cable and/or windings, and is most preferably, in direct contact with the cable and/or windings to facilitate an efficient heat transfer to the fluid circulating through the conduit. The presence of the current-carrying cable in the sub-surface soil creates a radial thermal gradient consisting of a series of successive isotherms substantially concentric with the core of the cable. The thermal gradient is obviously at its highest temperature closest to the cable, and diminishes with radial distance from the cable until the outermost isotherm equilibrates with the ambient temperature of the surrounding material. Hence, to maximise the efficiency of the transfer of the heat to the fluid, the first conduit should preferably be as close as possible to the cable and/or windings.

However, it should be appreciated that the proximity and spacing of the first conduit relative to the cable depends on the location and form (e.g. shape) of the cable, the material surrounding the cable and whether or nor the first conduit is installed during initial deployment of the cable or subsequently during a retro-fit installation. Thus, in some instances it may not be practical or possible to position the first conduit in direct contact with the cable, in which case some degradation in heat transfer efficiency would be expected. However, in most applications, it should be possible to position the first conduit relatively close to the cable so that sufficient heat transfer is possible to thereby permit cooling and heat recovery from the cable. The same applies to the windings of the transformer, and therefore the first conduit should either be in contact with or as close as possible to the windings.

In one preferred embodiment, the first conduit is helically wrapped around the at least one electrical power cable, either during installation (i.e. laying) of the cable or subsequently during a retro-fit excavation of the cable. Helically wrapping the conduit around the cable increases the overall length of the first conduit, which maximises the heat transfer. While in other arrangements, the first conduit may be linear and be disposed so as to be substantially parallel to the cable, or otherwise may have a substantially sawtooth or 'zig-zag' form to maximise its exterior surface, to again increase heat transfer. However, any suitable shape or form for the first conduit may be used in conjunction with the present invention, with the first conduit being placed above, below or adjacent the cable, or even between (where there are multiple cables) without sacrificing any of the benefits of the invention.

Hence, once installed the first conduit preferably remains underground with the cable or cables during its operational lifetime. Where an above-surface transformer is to be cooled, the first conduit may alternatively be above ground, or may be both above and below ground if a cable and transformer are to be cooled concurrently.

The heat transfer device is coupled to the first conduit preferably by way of a fluid pathway, which may comprise at least an out-flow conduit and a return-flow conduit. In preferred embodiments, the heat transfer device is a heat pump, and most preferably, a non-reversible heat pump, which may be located remotely from the first conduit, preferably above ground. However, any other form of heat transfer device may alternatively be used in conjunction with the present invention to recover heat energy from the heated fluid.

The out-flow conduit and the return-flow conduit may be made from the same material as the first conduit, and as such may preferably be copper pipes or tubes, each defining an internal bore for fluid passage therethrough. By "out-flow conduit" we mean the conduit through which the cooling fluid flows in a direction away from the heat transfer device and outwardly toward the first conduit. Whereas, by "return-flow conduit" we mean the conduit through which the heated fluid returns from the first conduit, in a direction towards the heat transfer device.

It is apparent therefore, that at least a part of the length of each of the out-flow conduit and the return-flow conduit preferably resides beneath the ground surface in fluid communication with the subterranean first conduit, with the remaining parts of the out-flow and return conduits preferably being routed for connection to the heat transfer device.

It should be appreciated however, that although the first conduit and the out-flow and return-flow conduits have preferably been described as separate components which can be connected together, it is envisaged that in at least some embodiments these features may correspond to a single integral pipeline, which forms a fluid circuit with the heat transfer device.

Preferably, the out-flow conduit and the return-flow conduit are covered by a thermally-insulating material to prevent heat transfer to the surrounding environment as the fluid is circulated around the fluid pathway. The insulation is particularly important for the return-flow conduit, as any heat losses from the heated fluid will reduce the overall efficiency of the heat recovery process. It is noted, however, that on the portions of the out-low and return-flow conduits close to the first conduit, and indeed along the first conduit itself, there is preferably no insulation, as this would generally impede the efficiency of the heat transfer to the circulating fluid.

In preferred embodiments, the out-flow conduit and the return-flow conduit are routed over ground for connection to the heat transfer device. As the heat transfer device is preferably located remotely to the first conduit, it follows that the out-flow and return conduits may extend for many meters or tens of meters or more depending on the location of the heat transfer device. Of course, the exact configuration will depend on the particular implementation and so the lengths of the out-flow and return-flow conduits are likely to be variable for each cooling arrangement. However, for practical reasons, it is preferred that the distance between the location of the first conduit and the position of the heat transfer device as not too great, as heat losses from the return-flow conduit increase as a function of the length of the conduit.

The fluid in the apparatus is preferably a coolant, such as a conventional refrigerant. However, any suitable heat conducting fluid may be used depending on the particular implementation, level of cooling required and/or efficiency of heat recovery desired. In some embodiments, it may also be possible to use distilled water or a water-based solution as the fluid, although this may not be as effective as other available coolants.

The fluid circulating means preferably comprises a pump. The pump may be hydraulic or electric, or a combination of both, and can be sized according to operational requirements. The fluid circulating means may be disposed at any point within the fluid pathway, but is preferably located in the out-flow conduit, but may alternatively form part of the heat transfer device itself.

The function of the fluid circulating means is to circulate the fluid around the fluid pathway and through the first conduit, so that the fluid preferably becomes heated as it passes through the first conduit. Due to the thermal contact between the first conduit and the current-carrying cable, heat is transferred to the fluid, preferably via conductive processes, which promotes evaporation of the fluid to thereby draw heat from the cable and into the partially vaporised fluid. The action of drawing heat from the cable, cools the cable, by removing heat energy, and lowers its temperature accordingly.

Cooling the cable in this way thereby reduces its operating temperature, which mitigates against the effects of thermal expansion. As a result, it is found that the longevity of the cable is consequently increased, over that of a non-cooled cable, while the wear and tear on the cable joints may also be significantly reduced. Moreover, as the cable is actively cooled by the apparatus, the cable can be operated at high load for considerably longer periods of time, which can remove some or all operational constraints, in that the need for re-routing supplies and/or load balancing can be avoided, or otherwise minimised.

The heating circuit is coupled to the heat transfer device and is adapted for interfacing with an external heating system. The provision of a heating circuit is particularly advantageous as it allows the heat energy recovered by the heat transfer device to be reused and transferred to the external heating system. In preferred embodiments, the heating circuit is coupled to the heat transfer device by a pair of fluid conduits, one of the conduits serving as an in-flow conduit and the other serving as a return-flow conduit. By 'in-flow conduit' we mean the conduit through which the heated fluid flows in a direction away from the heat transfer device and inwardly toward the heating circuit, while by 'return-flow conduit' we mean here the conduit through which fluid flows in a direction away from the heating circuit back towards the heat transfer device.

In some preferred embodiments, the heat transfer device may directly transfer the heated fluid itself from the fluid pathway (i.e. from the return-flow conduit coupled to the first conduit) to the heating circuit via the in-flow conduit of the heating circuit. Whereas in other embodiments, a heat exchange mechanism may operate which firstly recovers the heat energy from the heated fluid, which is then used to heat a separate fluid which flows into and out of the heating circuit. In either scenario, the heat transfer device acts to recover and concentrate the heat from the heated fluid, which can be pumped directly to the heating circuit or used to heat the separate fluid. Preferably, the heating circuit is configured to operate at a higher temperature.

In a further alternative embodiment, it may also be possible to incorporate a heat exchange mechanism in the heating circuit, so that heat can be extracted from the heated fluid received from the heat transfer device and used to heat a separate fluid for transfer to the external heating system. In this way, the fluid in the external heating system may be of a different type to that used in the apparatus of the invention.

The heating circuit preferably comprises an interface consisting of an out-flow conduit and a return-flow conduit. The function of the interface is to couple to an existing external heating system, such as a central heating system in a domestic or commercial premises. Any suitable interface conduits may be used in conjunction with the heating device of the present invention. However, it is envisaged that standard heating connectors and standard gauge piping will be used for compatibility with existing heating systems, particularly where a retro-fit implementation is contemplated. The conduits of the interface are preferably covered by a thermally insulating material to prevent heat losses to the environment when the heated fluid is en route to the external heating system.

In embodiments where the heated fluid from the fluid pathway of the cooling circuit is directly transferred to the heating circuit or where a heat exchange mechanism in the heat transfer device is used to heat a separate fluid in the heating circuit, the heating circuit may simply preferably comprise a hydraulic or electric pump, which acts to transfer the fluid to the external heating system via the interface out-flow conduit.

However, in embodiments where a heat exchange mechanism is incorporated into the heating circuit, the heat energy may firstly be extracted and used to heat a separate fluid, which is then preferably pumped by the heating circuit, via the interface out-flow conduit, to the external heating system.

The heated fluid from the heating circuit may then be used to replace the existing fluid (e.g. water) used in the external heating system or alternatively may correspond to the actual fluid in the external heating system which has been circulated through the heating circuit to heat the fluid via the heat exchange mechanism.

In this way, the apparatus of the present invention provides an efficient technique by which heat energy from the power cable or cables can be transferred to an external heating system to provide internal heating of a living or working space—without expending any additional fossil fuels. Hence, the present invention has profound environmental benefits as it reliably recycles essentially 'wasted' energy for use as a heating resource using readily available technology. As a result, individuals and companies will be able to lower their carbon footprints without sacrificing any heating requirements, simply by making use of heat energy that is hitherto dissipated into the ground.

It has been shown that from about 100 W to about 200 W of power, and typically around 150 W of power, may be recovered per meter of cable. Therefore, for example, around 15 kW of power may be obtained by each 100 meter length of cable, which with three cables per length, equates to around 45 kW of power. An average domestic property, assuming suitable insulation, requires somewhere around 8.5 kW per day for heating and hot water (allowing for seasonal variations), so it is certainly feasible that five such properties could be heated for each 100 meters of subterranean cable. When it is considered that the overall length of urban power cables in the UK alone is measured in many hundreds of kilometers, the usefulness and environmental credentials of this invention become immediately apparent, as it could play a significant role in reducing greenhouse emissions, both in the UK and elsewhere.

As a particular power cable may extend for many tens or hundreds of meters, the length of the first conduit, or rather the length of cable over which the first conduit extends, may therefore be variable and scalable depending on the desired length that is to be actively cooled. Thus, it should be appreciated that the first conduit may extend over any required length of the cable, depending on the particular implementation and arrangement.

However, for practical purposes there is usually a limit to the length of the cable that can be cooled by a single conduit and heat transfer device. Hence, a plurality of conduits and heat transfer devices may therefore be required for a particular cable. Consequently, a number of 'breakout points' are preferably needed along the cable's length. The breakout out points preferably correspond to the locations at which the outflow and return-flow conduits emerge from the ground, and may be spaced according to any one or more of the following criteria:

the quantity of heat required to be recovered per unit length of cable (which is determined by the loading on the cable—higher cable loads generate more heat requiring more breakout points)

the efficiency of the heat recovery (lower recovery efficiency requires fewer breakout points)

operational criteria relating to the end use of the recovered energy (e.g. the particulars of the external heating system, the size of the property to be heated and specific heat demand)

geographical considerations (e.g. limited by urban obstacles, such as road junctions, overlying buildings etc.)

the specific layout of the apparatus and particular configuration of the cable etc.

The apparatus of the present invention may take the form of at least one closed fluid circuit defined by a respective arrangement of first conduit, heat transfer device, fluid circulating means and heating circuit. For practical reasons, the apparatus is thus preferably comprised of a plurality of closed fluid circuits, each circuit preferably operable to recover heat from a respective predetermined length of the cable.

The closed fluid circuits may be directly adjacent each other or spaced apart, as required by the particular cooling and heat recovery requirements. Moreover, the heat transfer devices of each respective circuit may be located remotely from the heat transfer devices of the other circuits, each possibly being disposed proximal to a premises to be heated, or alternatively, each of the heat transfer devices may be arranged into a localised cluster or an array of heat transfer devices, with each device being coupled to a respective first conduit by way of a dedicated insulated fluid pathway.

In addition, although the heat transfer device and heating circuit have been described as separate components, it is possible that these could form an integral unit, with the heating circuit being a part of the heat transfer device and vice versa.

Of course, it should be understood that any suitable arrangement of conduits, fluid pathways, heat transfer devices and heating circuits may be used in conjunction with the present invention, with each particular implementation requiring a degree of bespoke design and configuration to accommodate geographical requirements and installation limitations etc.

According to a second aspect of the present invention there is provided a method for cooling and recovering heat from electrical power cables and/or transformers, comprising:

placing a first conduit in thermal contact with at least one electrical power cable and/or at least one transformer;

coupling a heat transfer device to the first conduit;

circulating, via a fluid circulating means, a fluid through the first conduit when a current is passing through the at least one electrical power cable and/or the transformer;

recovering, in the heat transfer device, at least a portion of the heat energy of the cable and/or transformer from the heated fluid; and making available the recovered heat energy at a heating circuit coupled to the heat transfer device for subsequent reuse by an external heating system.

It is to be understood that embodiments relating to the second aspect of the invention relate to the installation, operation and use of the apparatus as described in relation to any of the preceding embodiments. Therefore, the definitions and features as described in relation to the first aspect of the invention apply equivalently to the second aspect of the invention, and are thus not repeated for brevity of presentation.

It is envisaged that the method of the present invention will be used with both new installations of cable and subsequent retro-fit installations, whereby an existing cable or cables are excavated to enable the apparatus to be installed. The retro-fitting may occur during scheduled repair or maintenance of a cable, which may lower costs, or can be carried out specifically with the sole intention of installing the apparatus.

Hence, the first stage in installing the apparatus will typically require the excavation of a trench to receive a cable or of a trench that already contains a cable. An existing cable may be located using a ground penetrating radar or some other form of cable locating technique. For safety reasons, the utility company may preferably schedule a 'downtime', so that the cable is temporarily removed/isolated from the supply network. In this way, there is no risk of electrocution from a current-carrying cable.

Once the cable has been laid or exposed in the excavated trench, the first conduit is preferably disposed proximally to the cable, so that the conduit is in thermal contact with the cable. In preferred embodiments, the first conduit is helically wrapped around a predetermined length of the cable, and is preferably in direct contact with an outer surface of the cable.

In alternative embodiments, the first conduit may be disposed linearly substantially parallel to the longitudinal axis of the cable, or otherwise may be configured in a substantially sawtooth or 'zig-zag' pattern, either below, above or adjacent the cable, or between the cables (where there is more than one cable).

Of course, it is be appreciated that the positioning of the first conduit will depend on the particular implementation and configuration of the cable or cables, and may be affected by the type of cable to be cooled, geographical constraints, operational constraints and/or future cable access. However, it is clear that the design and location of the first conduit may be optimised for most efficient performance when installing new cables, as the installation operative then has more flexibility as to how to position the first conduit.

Once installed the first conduit is then either in direct contact or otherwise proximal to the subterranean power cable, so that it is able to receive heat energy from the cable, preferably via conductive processes.

As discussed above in relation to the first aspect of the invention, the first conduit is preferably coupled to the heat transfer device by way of a fluid pathway comprising at least an out-flow conduit and a return-flow conduit. The out-flow and return-flow conduits are preferably connected to the first conduit after it has been fitted to the cable, and may then be routed out of the trench towards the heat transfer unit. Any suitable connection technique may be used to connect the out-flow and return-flow conduits to the first conduit and the heat transfer unit.

As the heat transfer unit is preferably remotely located to the first conduit, and hence trench, the out-flow and return-flow conduits may extend for several meters or tens of meters or more depending on the particular implementation. However, to reduce heat losses, the conduits are preferably covered by a thermally insulating material.

The fluid circulating means is preferably located in the out-flow conduit of the fluid pathway, and is operable to circulate, by preferably pumping, a cooling fluid through the first conduit when the cable is carrying current. The fluid may be a coolant, such as a refrigerant or else may be water or a water-based solution, depending on the level of cooling required and desired heat recovery efficiency.

As the fluid is circulated around the fluid pathway, the fluid preferably becomes heated as it passes through the first conduit. Due to the thermal contact between the first conduit and the current-carrying cable, heat is transferred to the fluid, preferably via conductive processes, which promotes evaporation of the fluid to thereby draw heat from the cable and into the partially vaporised fluid. The action of drawing heat from the cable, cools the cable, by removing heat energy, and lowers its temperature accordingly.

The heated fluid is then pumped to the heat transfer device, which is operable to recover at least a portion, and preferably most, of the heat energy of the cable from the heated fluid. In preferred embodiments, the heat transfer device recovers the heat energy by way of a condensation process, which enables the heat to be extracted and made available to the heating circuit coupled to the heat transfer device by condensing the heated fluid.

The condensation process may be achieved by a heat exchange mechanism, which efficiently recovers the heat of the cable from the heated fluid.

Alternatively, the heat transfer device may provide the heated fluid itself directly to the heating circuit by preferably pumping the fluid to the heating circuit for transfer to the external heating system.

In another embodiment, the heat exchange mechanism may be used to heat a separate fluid in the heating circuit by transferring the recovered heat to the separate fluid, which can then be circulated around the heating circuit that is preferably operating at a higher temperature.

The heat transfer device and heating circuit are preferably coupled by way of a pair of fluid conduits, an in-flow conduit and a return-flow conduit, as described above in relation to the first aspect of the invention. Therefore, heated fluid may be provided to the heating circuit via the in-flow conduit. The heating circuit may directly pump the heated fluid or heated separate fluid to the external heating system of a domestic or commercial premises etc. or alternatively may extract the heat by way of an integral heat exchange mechanism, which can then be used to transfer the heat to a further fluid that resides within the circulatory network of the external heating system. In the latter case, this enables the fluid of the external heating system to be isolated from the fluid circulating in the heating circuit or heating circuit and fluid pathway, which can be advantageous if the fluids are of different types (e.g. a refrigerant and water etc.).

Where the heated fluid is pumped directly into the circulatory network of the external heating system, this takes the place of the existing fluid (e.g. water), and consequently heat is transferred to the premises for internal heating. Otherwise, the existing fluid in the external heating system may be heated via the heating circuit and circulated around the premises using the existing circulatory network. In either case, the source of the heat energy is the heat generated by the subterranean cable, which has been recovered by action of the present apparatus and method.

In transformer cooling applications, the method is essentially the same as just described, but it should be appreciated that excavation may not be required as the transformer may be above ground and consequently the conduit can be coupled to the windings via wrapping the conduit about the transformer.

As discussed above, the present invention provides significant benefits, both in terms of operational effectiveness and cost savings for utility companies, and environmental issues, in that the heating demands of premises may be met by reuse of essentially 'wasted' energy without the need for additional expenditure of fossil fuels. As a result, lower greenhouse emissions may be achieved for any premises that make use of the apparatus and method of the present invention, which has significant implications for limiting the impact and damage that global warming poses for future generations.

It is be appreciated that the level of heat recovery is likely to vary from one implementation to another, and indeed it is to be expected that retro-fit applications are probably going to yield lower levels of heat recovery, due to the reduced flexibility in installing the apparatus as a result of operational and geographic constraints etc. However, as the heat pumps tested with the present apparatus typically have a coefficient of performance (COP) of 4:1, meaning that up to four times the amount of energy is recovered, over that required to operate the heat pumps, lower heat recovery and operational efficiencies can still be tolerated without seriously impacting the overall benefits of the present invention.

Embodiments of the present invention will now be described in detail by way of example and with reference to the accompanying drawings in which.

Figure 1:
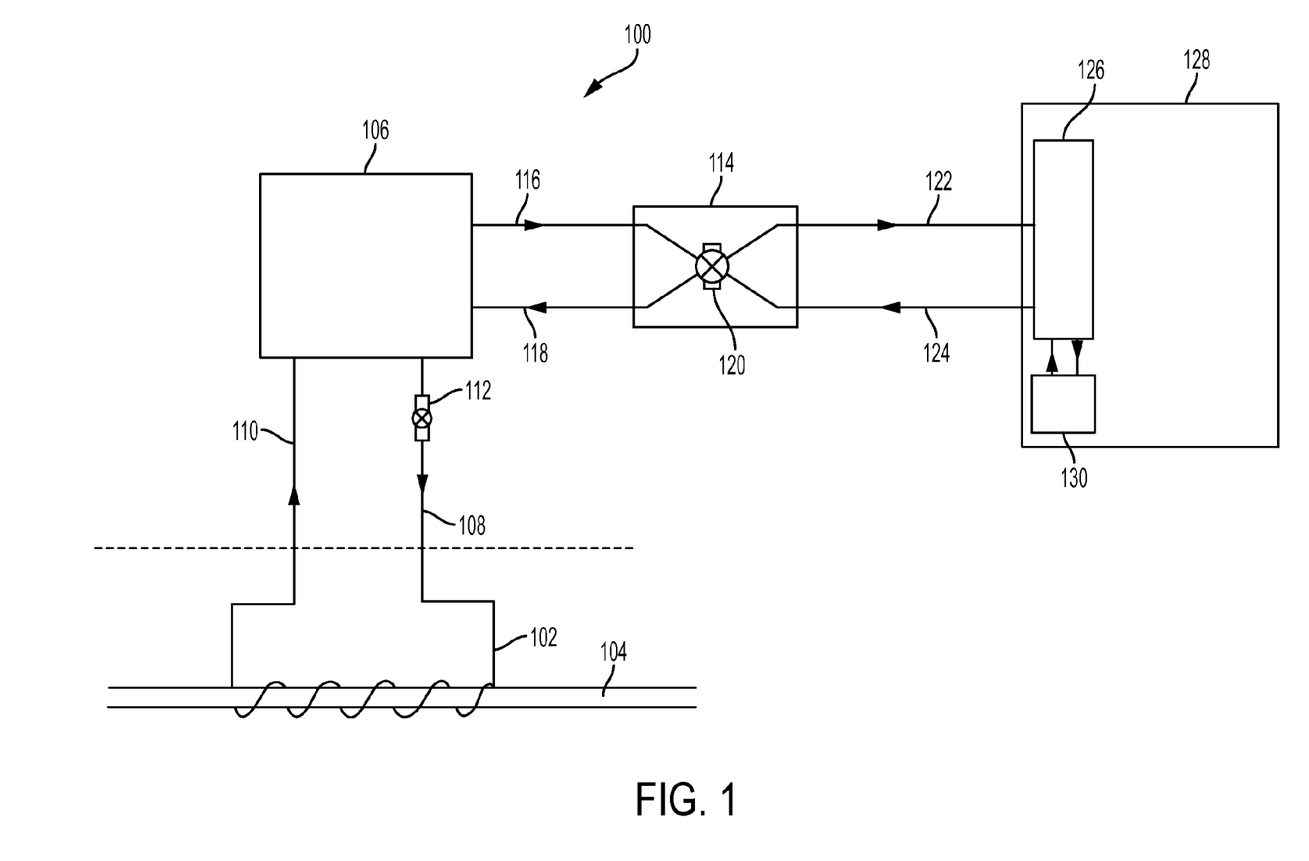
FIG. 1—shows a schematic view of a cable cooling and heat recovery apparatus according to an exemplary embodiment of the present invention.

Referring to FIG. 1, there is shown a particularly preferred embodiment of a cable cooling and heat recovery apparatus 100 according to the present invention. It is to be understood that the apparatus as shown in FIG. 1 is not drawn to scale and therefore the figure is intended for illustrative purposes only.

The apparatus 100 comprises a first conduit 102 in thermal contact with a subterranean electrical power cable 104, which is buried beneath the ground level denoted by the ghost lining. The cable 104 is a conventional hi-tension cable of a sort typically deployed in urban areas, and is operable to carry variable current loads. Typically, the cable 104 would be sheathed (not shown).

It should be appreciated that high-tension power cables are usually laid in sets of three, for operational reasons. However, for clarity only one cable is depicted in FIG. 1, which is not intended to be limiting. Thus, the present invention may be used in conjunction with any number of cables, or just one, without sacrificing any of the benefits of the present invention.

The apparatus 100 further comprises a heat transfer device 106, which in this example is a non-reversible heat pump, which is coupled to the first conduit 102 by way of a fluid pathway, comprising an out-flow conduit 108 and a return-flow conduit 110. The heat pump 106 is of conventional design and is scalable depending on the particular implementation and desired cooling requirements. Heat pumps are commercially available in a variety of sizes and at varying performance levels, with both single and dual heat pumps being suitable for use with the present apparatus.

By "out-flow conduit" we mean the conduit 108 through which the cooling fluid flows in a direction away from the heat transfer device 106 and outwardly toward the first conduit 102. Whereas, by "return-flow conduit" we mean the conduit 110 through which the heated fluid returns from the first conduit 102, in a direction towards the heat transfer device 106.

The first conduit 102, out-flow conduit 108 and return-flow conduit 110 are all made from copper pipe. As shown in FIG. 1, the first conduit 102 is helically wrapped around the cable 104 to maximise the length of the conduit to thereby ensure a good thermal contact with the cable 104 and to enhance the heat transfer efficiency. Of course, the first conduit 102 may alternatively by positioned in linear fashion, so as to run substantially parallel with the cable 104, or else can be placed below, above or adjacent the cable, or between the cable when multiple cables are present. In fact, any suitable configuration of the first conduit can be used provided there is a sufficiently good thermal contact between the cable 104 and the first conduit 102.

The first conduit 102 may be installed while the cable 104 is being initially laid, which is preferred, as this gives the installation operative more freedom to position the first conduit 102 proximal to the cable 104, or alternatively as part of a retro-fit installation, whereby the first conduit 102 is positioned some time after the cable 104 has been laid, and potentially after the cable is operational.

Any excavated trench is back-filled after installation, leaving a portion of each of the out-flow and return-flow conduits 108, 110 buried beneath the ground level and coupled to the subterranean first conduit 102. The out-flow and return-flow conduits 108, 110 are routed over land to the location of the heat pump 106, which is typically located remotely from the first conduit 102. The heat pump 106 and the first conduit 102 may be separated by several meters or tens of meters or more, depending on the particular implementation. In a typical setup, the heat pump 106 is normally positioned near to the premises or property 128 that is to be heated, at which point the out-flow and return-flow conduits 108, 110 are coupled to the heat pump 106. Both the out-flow conduit 108 and return-flow conduit 110 are covered by an thermally insulating material (e.g. a glass fibre or polymer based substance) to reduce heat transfer losses in the fluid pathway.

A cooling fluid, which in this example is a conventional refrigerant, resides within the fluid pathway defined by the out-flow conduit 108, first conduit 102, return-flow conduit 110 and heat pump 106. A fluid circulating means 112 in the form of an electric pump, is operable to circulate the fluid around the fluid pathway. The pump 112 is installed in the fluid path of the out-flow conduit 108, close to the heat pump 106.

As the fluid is pumped around the fluid pathway and through the first conduit 102, the fluid becomes heated as it passes through the first conduit 102. Due to the thermal contact between the first conduit 102 and the current-carrying cable 104, the heat generated by ohmic heating is transferred to the fluid, preferably via conductive processes, which promotes evaporation of the fluid to thereby draw heat from the cable 104 and into the partially vaporised fluid. The action of drawing heat from the cable 104, cools the cable, by removing heat energy, and lowers its temperature accordingly.

The heated fluid is then returned to the heat pump 106 by way of the return-flow conduit 110, whereupon the heat pump 106 recovers the heat energy of the cable 104 from the heated fluid, which may be by way of a condensation process.

Depending on the particular setup, the heat recovered from the heated fluid can then be used to heat a separate fluid provided to a heating circuit 114 coupled to the heat pump 106. Alternatively, the heat pump 106 may instead directly pump the heated fluid to the heating circuit 114. The heating circuit 114 is coupled to the heat pump 106 by way of a pair of conduits, an in-flow conduit 116 and a return-flow conduit 118.

By 'in-flow conduit' we mean the conduit 116 through which the heated fluid flows in a direction away from the heat pump 106 and inwardly toward the heating circuit 114, while by 'return-flow conduit' we mean here the conduit 118 through which fluid flows in a direction away from the heating circuit 114 back towards the heat pump 106.

Referring again to FIG. 1, in this example the heating circuit 114 comprises an electric pump 120 having dual flow conduits, so that it is able to pump the heated fluid to an external heating system 126 of a premises 128 to be heated. The heating circuit 114 comprises an interface consisting of an out-flow conduit 122 and a return-flow conduit 124. The interface conduits 122, 124 are configured to couple to the external heating system 126 of the premises 128. The external heating system 126 may be a central heating system or an under floor heating system etc.

In the interests of compatibility, the interface conduits 122, 124 are in the form of standard heating connectors and standard gauge piping, which can readily connect to the existing heating system 126. The interface conduits 122, 124 are covered by a thermally insulating material (e.g. a glass fibre or polymer based substance) to again prevent or minimise heat losses to the environment when the heated fluid is pumped to the external heating system 126.

Although not shown in FIG. 1, the heating circuit 114 may form an integral unit with the heat pump 106, or alternatively may be integrated with the external heating system 126 of the premises 128 to be heated.

The heated fluid pumped to the external heating system 126 replaces the existing fluid (e.g. water) used in the external heating system 126, and is thus pumped directly into the existing circulatory heating network of the premises 128. In this way, heat is then transferred to the premises 128 for internal heating. As a result, the boiler or heat generator 130 in the premises 128 can be switched out of the heating system 126, but may be retained a redundant backup in the case of system outage.

The cooled fluid can then be returned to the heating circuit 114 via the return-flow conduit 124 by the external heating system 126. Thereafter, it can then be reheated by the heat energy made available to the heating circuit 114 by action of the heat pump 106.

It should be appreciated that the present apparatus and method are inherently scalable, and hence although FIG. 1 depicts only a single first conduit, heat transfer device and heating circuit arrangement, any number of components may be used in order to actively cool and recover heat from a cable or network of cables, irrespective of the length(s) of the cable(s). Moreover, although not shown in FIG. 1, one or more transformers may also be present at a particular installation site. Therefore, these too may be cooled by a suitable arrangement of the present invention, even if the transformers are above ground or subterranean.

Figure 2:
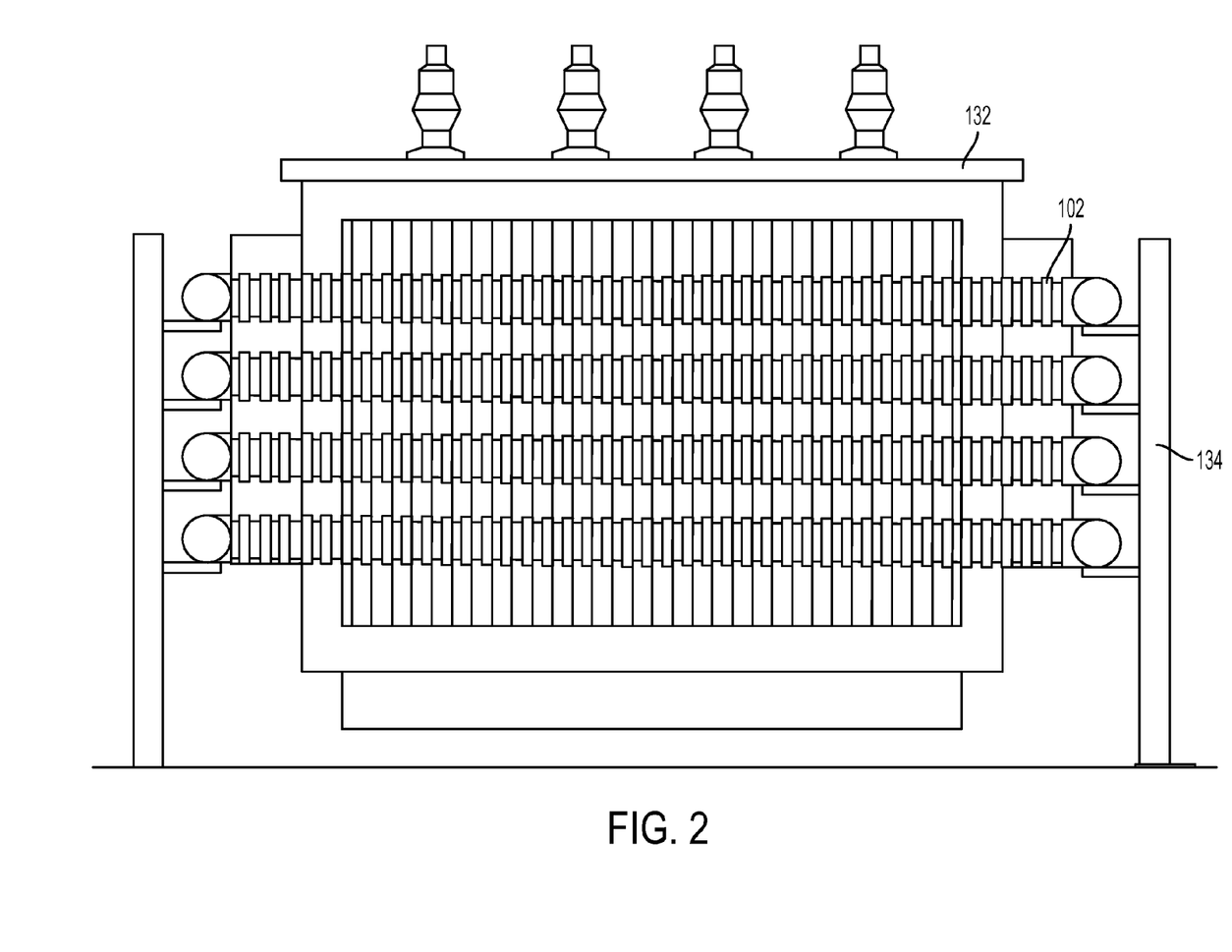
FIG. 2—shows a side view of a cable cooling and heat recovery apparatus according to a preferred embodiment of the present invention when applied to an example transformer.
Figure 3:
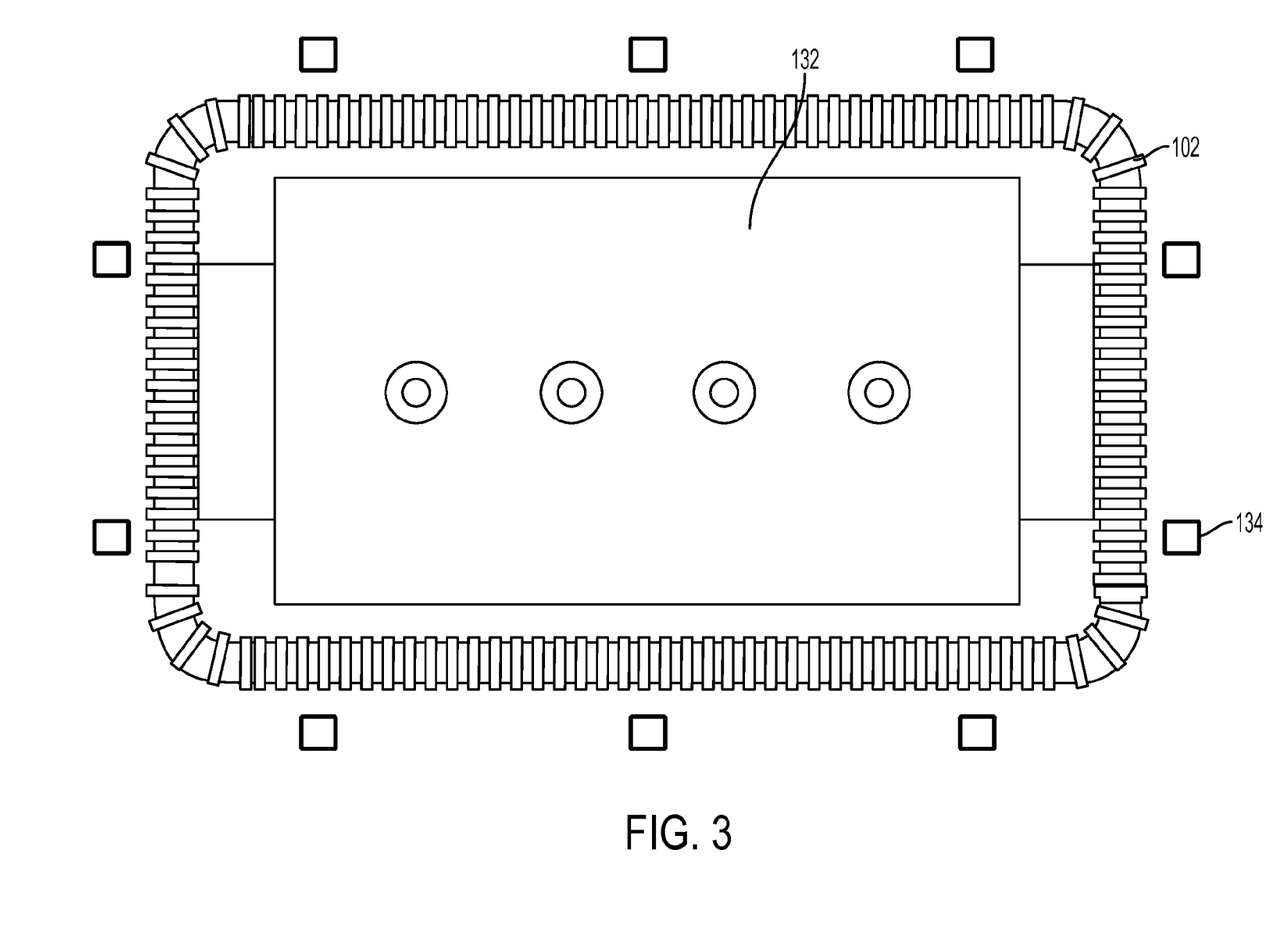
FIG. 3—shows a top plan view of the apparatus of FIG. 2.

Referring now to FIGS. 2 and 3, there are shown respective side and top plan views of a preferred embodiment of the cable cooling and heat recovery apparatus 100 of the present invention. In this embodiment, the apparatus has been configured to cool a transformer 132, such as a power transformer as typically used in sub-station arrangements and power distribution networks etc. As shown in FIGS. 2 and 3, the first conduit 102 is wrapped around the exterior of the transformer 132, such that the conduit 102 is in thermal contact with the transformer windings (not shown). In this way, the apparatus 100 is operable to cool the transformer 132 by extracting the heat energy generated by the transformer when it is carrying current. The conduit 102 may be comprised of several separate loops, as shown in FIG. 2, or alternatively may be a single length of conduit helically wrapped around the transformer 132. However, it is to be appreciated that any suitable configuration of the conduit may be used to cool and extract heat from the transformer.

The first conduit 102 may be supported via a rack arrangement or shelved support 134, as shown in FIG. 2. However, again is to be appreciated that any suitable support mechanism may be used to maintain the conduit in position about the transformer during use. The shelved support 134 may be permanently fixed in position or else can be a temporary structure (which can be moved subsequently for re-deployment elsewhere).

Although the cable cooling and heat recovery apparatus of the present invention is ideally suited for reducing the temperature of subterranean hi-tension power cables and transformers, while recovering heat therefrom, it will be recognised that one or more of the principles of the invention may extend to other cable types and/or other cooling and heat recovery applications, whereby it is desired to make use of, or recycle, a dissipated heat, which otherwise would be lost to the surrounding environment.

The above embodiments are described by way of example only. Many variations are possible without departing from the invention.

The invention claimed is:

1. An apparatus for cooling and recovering heat from electrical power cables and/or transformers, the apparatus comprising:
    a first conduit disposed externally to at least one electrical power cable and/or at least one transformer for thermal contact therebetween;
    a heat transfer device coupled to the first conduit;
    fluid circulating means; and
    a heating circuit coupled to the heat transfer device for interfacing with an external heating system,
    wherein, in use, the fluid circulating means is operable to circulate a coolant through the first conduit, without the at least one electrical power cable and/or the at least one transformer being in contact with the coolant, to thereby enable the heat transfer device to recover at least a portion of the heat energy dissipated by the at least one electrical power cable and/or the at least one transformer from the heated coolant for subsequent reuse by the external heating system via the heating circuit.

2. The apparatus of claim 1, wherein the first conduit is disposed proximally to the at least one electrical power cable and/or the at least one transformer.

3. The apparatus of claim 1, wherein the first conduit is helically wrapped around the at least one electrical power cable and/or the at least one transformer.

4. The apparatus of claim 1, wherein the first conduit is a pipe.

5. The apparatus of claim 1, wherein the heat transfer device is located remotely from the first conduit.

6. The apparatus of claim 1, wherein the heat transfer device is coupled to the first conduit by way of a fluid pathway comprising at least an out-flow conduit and a return-flow conduit.

7. The apparatus of claim 6, wherein the out-flow conduit and the return-flow conduit are covered by a thermally-insulating layer.

8. The apparatus of claim 1, wherein the heat transfer device is a heat pump.

9. The apparatus of claim 8, wherein the heat pump is a non-reversible heat pump.

10. The apparatus of claim 1, wherein the fluid circulating means comprise a pump.

11. The apparatus of claim 1, wherein the heating circuit is coupled to the heat transfer device by a pair of fluid conduits.

12. The apparatus of claim 1, wherein the heating circuit comprises a heat exchange mechanism.

13. The apparatus of claim 12, wherein the heat exchange mechanism is operable to interface with an external heating system and to transfer the recovered heat to that system.

14. The apparatus of claim 1, wherein the heating circuit comprises a pump.

15. The apparatus of claim 1, wherein the heating circuit comprises an interface including an out-flow conduit and a return-flow conduit.

16. The apparatus of claim 1, wherein the apparatus is configured in the form of at least one closed fluid circuit.

17. The apparatus of claim 16, further comprising a plurality of closed fluid circuits, each circuit operable to recover heat from a respective predetermined length of an electrical power cable and/or transformer.

18. The apparatus of claim 1, wherein the heat transfer device is operable to recover from about 100 W to about 200 W of power per meter length of cable.

19. The apparatus of claim 17, wherein the heat transfer device of each circuit is located remotely from the heat transfer devices of the other circuits.

20. The apparatus of claim 17, wherein the heat transfer device of each circuit forms a localized array with the heat transfer devices of the other circuits.

21. A method of cooling and recovering heat from electrical power cables and/or transformers, the method comprising:
    disposing a first conduit externally to at least one electrical power cable and/or at least one transformer for thermal contact therebetween;
    coupling a heat transfer device to the first conduit;
    circulating, via a fluid circulating means, a coolant through the first conduit when a current is passing through the at least one electrical power cable and/or the at least one transformer, without the at least one electrical power cable and/or the at least one transformer being in contact with the coolant;
    recovering, in the heat transfer device, at least a portion of the heat energy dissipated by the at least one electrical power cable and/or the at least one transformer from the heated coolant; and
    making available the recovered heat energy at a heating circuit coupled to the heat transfer device for subsequent reuse by an external heating system.

22. The method of claim 21, wherein disposing the first conduit comprises locating the first conduit proximally to the at least one electrical power cable and/or the at least one transformer.

23. The method of claim 22, wherein disposing the first conduit further comprises locating the first conduit below ground level proximal to a subterranean electrical power cable.

24. The method of claim 21, wherein disposing the first conduit comprises helically wrapping the conduit around the at least one electrical power cable and/or the at least one transformer.

25. The method of claim 21, further comprising coupling the heat transfer device to the first conduit by way of a fluid pathway comprising at least an out-flow conduit and a return-flow conduit.

26. The method of claim 21, wherein the step of circulating the coolant includes pumping the fluid through the first conduit.

27. The method of claim 21, further comprising coupling the heating circuit to the heat transfer device via a pair of fluid conduits.

28. The method of claim 21, wherein recovering the heat energy comprises condensing the heated coolant and extracting the heat energy.

29. The method of claim 21, wherein recovering the heat energy recovers from about 100 W to about 200 W of power per meter length of cable.

30. The method of claim 21, further comprising interfacing the heating circuit with an external heating system and transferring the recovered heat to the external heating system.

31. The method of claim 30, wherein transferring the recovered heat comprises pumping heated fluid to the external heating system.

\* \* \* \* \*